United States Patent
Park

(10) Patent No.: US 6,906,977 B2
(45) Date of Patent: Jun. 14, 2005

(54) REFRESH CONTROLLING METHOD AND APPARATUS

(75) Inventor: Soo-hee Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 92 days.

(21) Appl. No.: 10/653,454

(22) Filed: Sep. 3, 2003

(65) Prior Publication Data

US 2004/0105335 A1 Jun. 3, 2004

(30) Foreign Application Priority Data

Sep. 3, 2002 (KR) .................. 10-2002-0052920

(51) Int. Cl.$^7$ ............................................. G11C 7/00
(52) U.S. Cl. .................................................. 365/222
(58) Field of Search ........................ 365/222, 185.25, 365/149

(56) References Cited

U.S. PATENT DOCUMENTS

| | | | | |
|---|---|---|---|---|
| 5,440,711 A | * | 8/1995 | Sugimoto | 711/106 |
| 5,822,265 A | * | 10/1998 | Zdenek | 365/222 |
| 6,510,489 B2 | * | 1/2003 | Komoto | 711/106 |

FOREIGN PATENT DOCUMENTS

JP   05-198170   8/1993

* cited by examiner

Primary Examiner—Tan T. Nguyen
(74) Attorney, Agent, or Firm—Staas & Halsey LLP

(57) ABSTRACT

A refresh controlling method and a refresh controlling apparatus includes a count initialization value setting unit to set a count initialization value at an initial refresh interval or a changed refresh interval, and a bus request signal generation unit to generate a bus request signal when the count initialization value is completely lapsed. The apparatus also includes a refresh signal generator generate a refresh signal when a bus approval signal is generated by detection of a bus blank period, during which a bus request signal is not received from bus master devices, or when a bus approval signal is generated in response to the bus request signal received from the bus request signal generation unit. According to a logic signal received from the bus request signal generation unit, a bus blank determiner determines whether the bus approval signal has been generated due to the bus blank period. If it is determined that the bus approval signal has been generated due to the bus blank period, the bus blank determiner controls the count initialization value setting unit, the bus request signal generation unit, and the refresh signal generator.

24 Claims, 3 Drawing Sheets

REFRESH CONTROLLING METHOD AND APPARATUS

CROSS-REFERENCE TO RELATED APPLICATIONS

This application claims the priority of Korean Patent Application No. 2002-52920, filed on Sep. 3, 2002, in the Korean Intellectual Property Office, the disclosure of which is incorporated herein in its entirety by reference.

BACKGROUND OF THE INVENTION

1. Field of the Invention

The present invention relates to a refresh controlling method and a refresh controlling apparatus, and more particularly, to a refresh controlling method, by which a refresh interval may flexibly vary depending on a current state of an internal bus in a controller chip by performing a refresh operation when a bus blank period is detected, before a regular refresh interval has completely lapsed.

2. Description of the Related Art

General dynamic RAMs (DRAMs) includes a plurality of cells, each of which is composed of a capacitor and a transistor. The transistor charges the condenser with electricity or discharges the electricity from the condenser. DRAMs store data in the condenser. Since the compacitor loses data due to a spontaneous electricity discharge after a lapse of a predetermined period of time, for example, about 2 ms, a refresh control circuit is required to prevent the data loss.

FIG. 1 is a block diagram of a structure of a conventional refresh controlling apparatus 100 and a peripheral unit thereof, namely, a bus mediator 120. The conventional refresh controlling apparatus 100 includes a storage unit 111, a counter 113, a comparator 115, and a refresh signal generator 117. The bus mediator 120 mediates the right of use of an internal bus in a chip among a plurality of bus master devices.

In the refresh controlling apparatus 100, the storage unit 111 receives a refresh interval 131 and stores the same in synchronization with a system clock 132. The refresh interval 131 is obtained by dividing a refresh period of a currently used DRAM by a number of rows. The counter 113 performs down or up counting on a refresh interval 133, which is stored in the storage unit 111, in synchronization with the system clock 132. The comparator 115 compares a count value 135, which is output from the counter 113, with a refresh interval 134, which is output from the storage unit 111. If the count value 135 is equal to the refresh interval 134, the comparator 115 generates a bus request signal 136 and outputs the same to the bus mediator 120. The bus mediator 120 generates a bus approval signal 137 in response to the bus request signal 136. In response to the bus approval signal 137, the refresh signal generator 117 generates a refresh command or a refresh informing signal. According to this structure, the refresh controlling apparatus 100 refreshes each row of a DRAM at a refresh interval, which is obtained by dividing a refresh period for each DRAM by a number of rows of memory cells.

As described above, a DRAM must periodically perform a refresh operation in order to prevent loss of the data stored in each cell. Hence, when a controller chip is designed using the DRAM as a data storage device, a refresh controlling apparatus is included and used as a bus master device. A typical controller chip includes at least two bus master devices, such as a CPU, a DMA controller, etc. The bus mediator 120 mediates the right of use of a bus according to the priority of the bus master devices. However, if each of the memory cells of a current memory is not properly refreshed during a predetermined refresh period, data stored in the current memory may be lost. Accordingly, there is a tendency to give the refresh controlling apparatus 100 a priority over the other bus master devices.

In this case, if a refresh controlling apparatus and other bus master devices simultaneously request the use of an internal bus of a controller chip, the refresh controlling apparatus preferentially has a bus usage right, while the other bus master devices cannot use the internal bus until the refresh controlling apparatus completes its refresh operation. Thus, as a number of collisions between bus usage requests of the refresh controlling apparatus and the other bus master devices increase, efficiency of the use of the internal bus of the controller chip degrades. Degradation of a performance of the internal bus leads to a deterioration of a performance of the controller chip.

SUMMARY OF THE INVENTION

Accordingly, it is an aspect of the present invention to provide a refresh controlling method, in which a DRAM is refreshed during a predetermined refresh interval, wherein as many refresh events as a predetermined number of bus blanks allowed within the predetermined refresh interval are executed on the DRAM upon detection of a bus blank period before the predetermined refresh interval has completely lapsed, and the DRAM is refreshed at a changed refresh interval.

The present invention also provides a refresh controlling apparatus that is optimal to implement the refresh controlling method.

The present invention also provides a controlling system employing the refresh controlling apparatus.

Additional aspects and advantages of the invention will be set forth in part in the description which follows and, in part, will be obvious from the description, or may be learned by practice of the invention.

The foregoing and/or other aspects of the present invention are achieved by providing a refresh controlling method, in which given a plurality of bus master devices, a DRAM with n rows of memory cells is refreshed during a predetermined refresh period. The refresh controlling method includes generating a first refresh signal to refresh each of the memory cell rows of the DRAM at an initial refresh interval, generating a second refresh signal, when a bus blank period, during which a bus request signal is not received from the bus master devices, occurs before the initial refresh interval is completely lapsed, and a bus approval signal is accordingly applied, and generating a third refresh signal to refresh a next memory cell row of the DRAM at a changed refresh interval, after a refresh event is executed in response to the second refresh signal.

The foregoing and/or other aspects of the present invention are achieved by providing a refresh controlling apparatus, by which given a plurality of bus master devices, a DRAM with n rows of memory cells is refreshed during a predetermined refresh period. The refresh controlling apparatus includes a count initialization value setting unit to set a count initialization value at an initial refresh interval or a changed refresh interval, a bus request signal generation unit to generate a bus request signal when the count initialization value is completely counted, and a refresh signal generator to generate a refresh signal when a bus approval signal is generated by detection of a bus blank period, during which a bus request signal is not received from the bus master devices, or when a bus approval signal is generated in response to the bus request signal received from the bus request signal generation unit. The refresh controlling apparatus also includes a bus blank determiner to determine whether the bus approval signal has been generated due to the bus blank period according to a logic signal received from the bus request signal generation unit, and to control the count initialization value setting unit, the bus request signal generation unit, and the refresh signal generator, if it is determined that the bus approval signal has been generated due to the bus blank period.

The foregoing and/or other aspects of the present invention are achieved by providing a controller system including a bus mediator to mediate the right of use of a bus among a plurality of bus master devices and to automatically generate a bus approval signal during a bus blank period, during which a bus request signal is not received from the bus master devices. The system also includes a refresh controlling apparatus to refresh each of n rows of a DRAM during a predetermined refresh period at an initial refresh interval, to refresh a respective row when the bus approval signal depending on the bus blank period is generated by the bus mediator before the initial refresh interval is completely counted, and to refresh the next row at a changed refresh interval.

BRIEF DESCRIPTION OF THE DRAWINGS

The above and/or other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
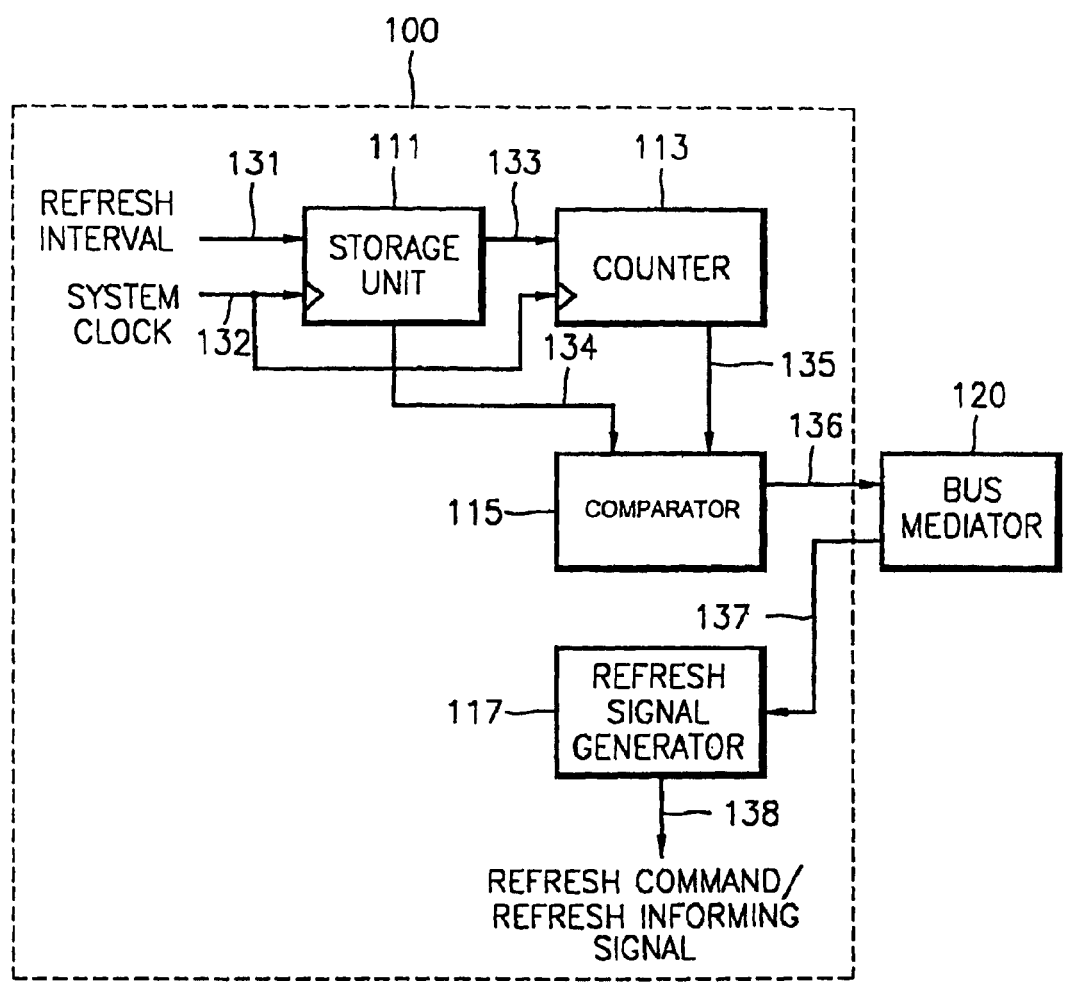
FIG. 1 is a block diagram of a structure of a conventional refresh controlling apparatus.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Figure 2:
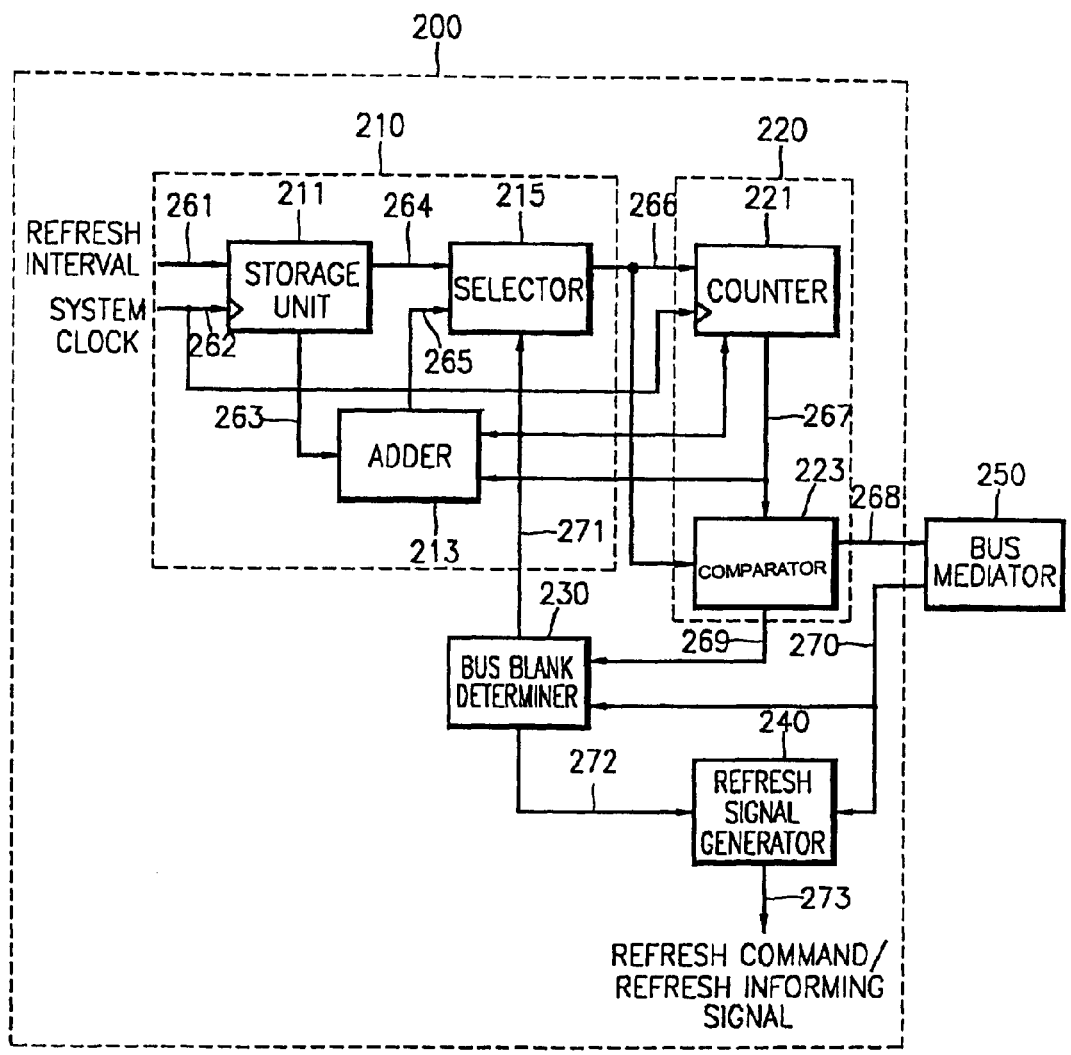
FIG. 2 is a block diagram of a structure of a controller system to adopt a refresh controlling apparatus, according to an embodiment of the present invention.

A controller system of FIG. 2 adopts a refresh controlling apparatus 200 according to an embodiment of the present invention and a bus mediator 250. The refresh controlling apparatus 200 includes a count initialization value setting unit 210, a bus request signal generation unit 220, a bus blank determiner 230, and a refresh signal generator 240.

The bus mediator 250 mediates the right of use of an internal bus in a chip among a plurality of bus master devices including the refresh controlling apparatus 200. The count initialization value setting unit 210 includes a storage unit 211, an adder 213, and a selector 215, and the bus request signal generation unit 220 includes a counter 221 and a comparator 223.

The refresh controlling apparatus 200 does not use a burst refreshing method, in which simultaneous refreshing of all memory cells drives a refresh controlling apparatus to occupy a common bus of a chip for a long time so that other bus master devices cannot use the bus for a predetermined period of time. Instead, the refresh controlling apparatus 200 obtains a refresh interval by dividing a refresh period, which is predefined in a DRAM, by a number of rows and refreshes the memory cells in each row during the refresh interval.

In the count initialization value setting unit 210, the storage unit 211 stores an initial refresh interval 261 in synchronization with a system clock 262.

In response to a first control signal 271 output from the bus blank determiner 230, the adder 213 adds an initial refresh interval 263 stored in the storage unit 211 to a count value 267 of the counter 221 to obtain a changed refresh interval 265 and outputs the same to the selector 215. The changed refresh interval 265, Tv, is given by Equation 1:

$$Tv = (n+1)Ti - \sum_{i=1}^{n} Ci \quad (1)$$

wherein n is an integer smaller than or equal to the number of times of allowance of a bus blank and denotes a number of consecutive occurrences of a bus approval signal depending on the bus blank. Ti denotes an initial refresh interval, and Ci denotes the count value 267 at a time when the counter 221 is stopped by occurrence of the bus approval signal depending on the bus blank.

In response to the first control signal 271 output from the bus blank determiner 230, the selector 215 selects either an initial refresh interval 264, which is output from the storage unit 211, or the changed refresh interval 265, which is output from the adder 213, and applies the selected interval value to the counter 221 so that the selected interval is used as a count initialization value 266 of the counter 221.

In the bus request signal generation unit 220, the counter 221 counts down or up in synchronization with the system clock 262 when it receives the count initialization value 266 from the selector 215. In response to the first control signal 271 outputted from the bus blank determiner 230, the counter 221 stops counting. For convenience of explanation, the counter 221 is assumed as a down counter.

The comparator 223 checks if the count value 267 of the counter 221 has been counted down by the value of the refresh interval 266 selected by the selector 215. If the count value 267 of the counter 221 has been counted down by the value of the refresh interval 266, the comparator 223 generates a bus request signal 268, applies the same to the bus mediator 250, and applies a logic signal 269, which is the result of the comparison, to the bus blank determiner 230.

The bus blank determiner 230 determines the cause of generation of a bus approval signal 270 by referring to the logic signal 269 received from the comparator 223. If it is determined that the bus approval signal 270 is not generated by the bus request signal 268, the bus blank determiner 230 supplies the first control signal 271 to the adder 213, the selector 215, and the counter 221 and a second control signal 272 to the refresh signal generator 240. The first control signal 271 stops the counting of the counter 221, controls the adder 213 to add the count value 267 of the counter 221 to the initial refresh interval 263 stored in the storage unit 211 to obtain the changed refresh interval 265, and controls the selector 215 to select the changed refresh interval 265. The second control signal 272, that is, the predetermined number of times a bus blank is allowed, controls the number of times the signal generator 240 generates a refresh signal 273 (i.e., a refresh command/refresh informing signal) during a bus blank period.

The refresh signal generator 240 generates the refresh signal 273 in response to the bus approval signal 270 received from the bus mediator 250. If the bus approval signal 270 is generated by a bus blank period detected by the bus mediator 250, the number of times the refresh signal generator 240 generates the refresh signal 273 depends on the number of times the bus blank is allowed, which is provided by the bus blank determiner 230. According to a developer's taste, the refresh controlling apparatus 200 may exist within a memory controlling apparatus or exist as a master device installed outside the memory controlling apparatus. If the refresh controlling apparatus 200 is installed in the memory controlling apparatus, the refresh signal 273 is a refresh command. If the refresh controlling apparatus 200 is implemented as a module separate from the memory controlling apparatus, the refresh signal 273 is a refresh informing signal. The refresh informing signal is transmitted to the memory controlling apparatus. The memory controlling apparatus may generate the refresh command depending on existence or non-existence of the refresh informing signal.

The bus mediator 250 mediates the right of use of a bus among a plurality of bus master devices that includes the refresh controlling apparatus 200. When the bus mediator 250 detects a bus blank period, during which no bus request signals are received from the bus master devices excluding the refresh controlling apparatus 200, the bus mediator 250 automatically applies the bus approval signal 270 to the refresh controlling apparatus 200 during the bus blank period.

The number of times of allowance of a bus blank is predetermined by the bus blank determiner 230 and denotes a maximum number of times a refresh signal may be consecutively generated when the bus mediator 250 outputs a bus approval signal upon every detection of a bus blank period. The number of times the bus blank is allowed will now be described with reference to FIGS. 3 through 5.

Figure 3:
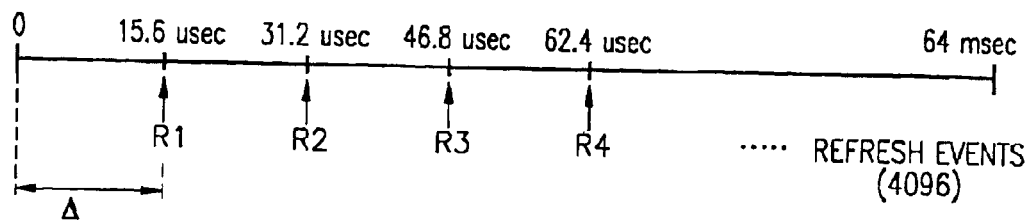
FIG. 3 shows a pattern in which a refresh command is generated when no bus blanks are used.

FIG. 3 shows a pattern in which a refresh command is generated when a bus blank is never allowed in the controller system of FIG. 2. When 4096 rows must be refreshed for a 64 millisecond refresh period, if no bus blank periods occur or the bus blank determiner 230 is implemented so as to prevent an irregular refresh operation from occurring even when a bus approval signal depending on a bus blank period is generated, 4096 refresh events occur during an initial refresh interval ($\Delta$=15.6 $\mu$sec).

Figure 4:
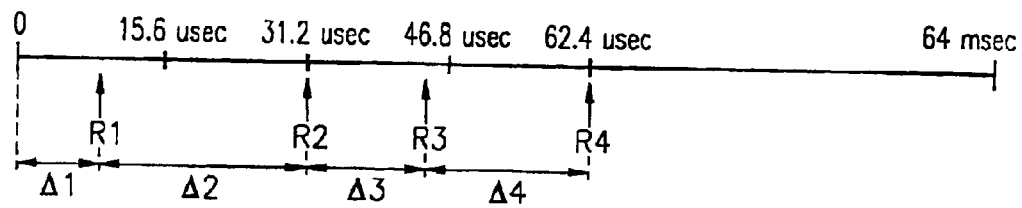
FIG. 4 shows a pattern in which a refresh command is generated when a bus blank is allowed only one time within an initial refresh interval in the controller system of FIG. 2.

FIG. 4 shows a pattern in which a refresh command is generated when a bus blank is allowed one time within the initial refresh interval in the controller system of FIG. 2. In this case, the counter 221 counts by $\Delta 1$, for example, 8 $\mu$sec, using the initial refresh interval ($\Delta$=15.6 $\mu$sec) as a count initialization value. At this time, a bus approval signal depending on a bus blank period is generated by the bus mediator 250, and the refresh signal generator 240 generates a refresh informing signal or a refresh command to perform a refresh operation R1. A changed refresh interval ($\Delta 2$) of 23.2 $\mu$sec is obtained by adding a value of 7.6 $\mu$sec, which is the result of a subtraction of $\Delta 1$ from the initial refresh interval ($\Delta$=15.6 $\mu$sec), to the initial refresh interval. The changed refresh interval ($\Delta 2$) is also calculated as 23.2 $\mu$sec even by Equation 1. Hence, to execute a refresh operation R2 after the refresh operation R1, the counter 221 performs counting by using the changed refresh interval as a count initialization value instead of the initial refresh interval. After the refresh operation R2, the counter 221 resumes counting by using the initial refresh interval as the count initialization value. For example, after the refresh operation R2, counting continues by $\Delta 3$. At this time, a bus blank period is detected, and a bus approval signal is accordingly applied to the refresh controlling apparatus 200. In response to the bus approval signal, the refresh controlling apparatus 200 performs a refresh operation R3.

As described above, if the bus blank is allowed only one time within the initial refresh interval, the refresh operation occurs one time upon application of the bus approval signal depending on the bus blank period. Thereafter, even though the bus approval signal depending on the bus blank period is continuously received from the bus mediator 250, the bus blank determiner 230 controls the counter 221 to count the changed refresh interval for the refresh operation R2 down, and controls the refresh signal generator 240 to not generate the refresh signal until the comparator 223 detects a '0' count value.

Figure 5:
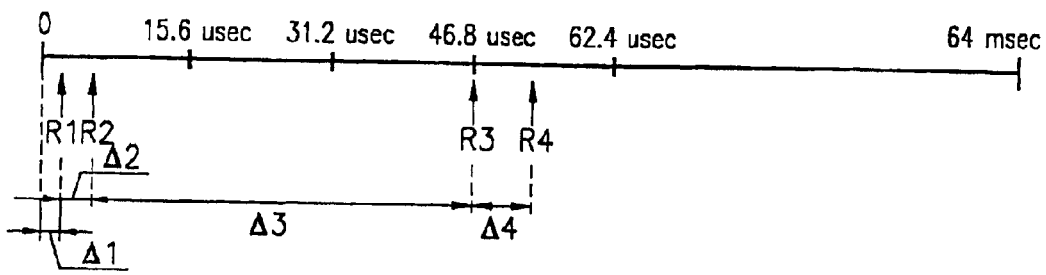
FIG. 5 shows a pattern in which a refresh command is generated when a bus blank is allowed two times within an initial refresh interval in the controller system of FIG. 2.

FIG. 5 shows a pattern in which a refresh command is generated when a bus blank is allowed two times within the initial refresh interval in the controller system of FIG. 2. In this case, during the bus blank period, the refresh operations R1 and R2 occur, and count values after the bus blank period are accumulated. Accordingly, a refresh operation R3 occurs after a changed refresh interval of $\Delta 3$. After the changed refresh interval of $\Delta 3$, counting is executed by, for example, $\Delta 4$. Thereafter, a bus approval signal depending on a bus blank period is re-generated, and accordingly, a refresh operation R4 occurs.

When the number of times the bus blank is allowed increases in this way, the refresh operation may be executed before the predetermined initial refresh interval has completely lapsed, by adequately using a bus blank period in which an internal bus in a chip is not requested. Accordingly, the number of cases decreases when the refresh controlling apparatus requests the bus at the same time with other bus master devices and make the other bus master devices wait until it cancels the bus usage request. The number of times a bus blank is allowed may be properly set by a developer, depending on the size of the storage unit 211 and the counter 221.

Figure 6:
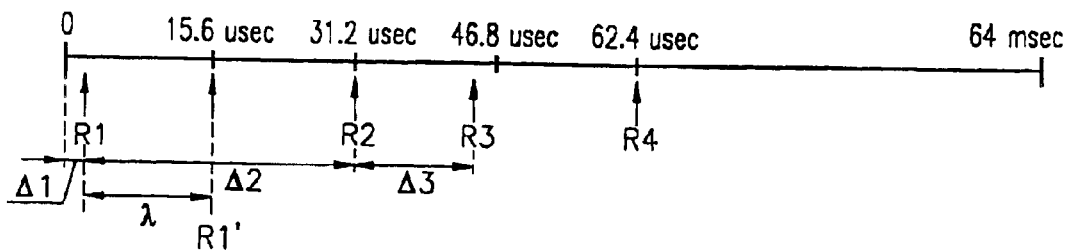
FIG. 6 is a view to explain a difference between changed refresh intervals caused by the use of a bus blank in the controller system of FIG. 2.

FIG. 6 is a view explaining a difference between changed refresh intervals caused by the use of the bus blanks in FIG. 2. When a refresh operation R1 $\Delta$ occurs in the refresh period following the refresh period during which 4096 refresh operations including a refresh operation R1 are executed on 4096 rows of memory cells, if no bus approval signals depending on a bus blank period are generated, the refresh operation R1 $\Delta$ is executed $\lambda$ after the time of the refresh operations R1 with respect to the first memory cell row. If it is assumed as a worst case scenario that the refresh operation R1 occurred at the point of time when $\Delta 1$ is 0, $\lambda$ increases by the initial refresh interval ($\Delta$=15.6 $\mu$sec).

Hence, the time interval, after which a memory cell row already refreshed before the lapse of a regular refresh interval due to the use of a bus blank period is re-refreshed, may exist surely within a predetermined refresh period by, preferably, setting the initial refresh interval to be refresh period/(the number of rows+the number of times a bus blank is allowed). Then, although a refresh operation occurs earlier than the initial refresh interval by using a bus blank period, a refresh operation with respect to each row may always be executed within the predetermined refresh period, thus preventing loss of memory cell data.

Table 1 shows actual initial refresh intervals, calculated by compensating for a refresh interval error on the same row caused with an increase in the number of times a bus blank is allowed, and further shows count initialization values obtained for individual system clock operating frequencies, namely, 60 MHz, 100 MHz, and 130 MHz, given a 64 msec refresh period and a memory with 4096 rows.

| The number of time a bus blank is allowed | The number of row + the number of time a bus blank is allowed | Initial refresh interval (usec) | Count initialization value when 60 MHz is used | Count initialization value when 100 MHz is used | Count initialization value when 130 MHz is used |
|---|---|---|---|---|---|
| 0 | 4096 | 15.625 | 937 | 1562 | 2031 |
| 1 | 4097 | 15.621 | 937 | 1562 | 2030 |
| 2 | 4098 | 15.617 | 936 | 1561 | 2030 |
| 3 | 4099 | 15.613 | 936 | 1561 | 2029 |
| 4 | 4100 | 15.609 | 936 | 1560 | 2029 |

The above-described embodiments of the present invention may be written as programs which may be executed in a computer, and may be realized in a general-purpose digital computer, which executes the programs, using computer-readable recording media. The computer-readable recording media include magnetic storage media such as ROMs, floppy discs, and hard discs, optical reading media such as CD-ROMs and DVDs, and storage media using carrier waves transmitted via the Internet.

As described above, according to the present invention, a refresh interval flexibly varies depending on the current state of an internal bus in a chip by performing a refresh operation during a bus blank period before a regular refresh interval has completely lapsed. Thus, the possibility of a collision between bus requests of a refresh controlling apparatus and other bus master devices is reduced. Also, all of the memory cells of a DRAM may be refreshed within a refresh period without loss of data stored in the DRAM memory cells. Accordingly, the internal bus in the chip may be more effectively used.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A refresh controlling method, in which given a plurality of bus master devices, a DRAM with n rows of memory cells is refreshed during a predetermined refresh period, the refresh controlling method comprising:

generating a first refresh signal to refresh each of the memory cell rows of the DRAM at an initial refresh interval;

generating a second refresh signal, when a bus blank period during which a bus request signal is not received from the bus master devices, occurs before the initial refresh interval is completely lapsed, and a bus approval signal is accordingly applied; and generating a third refresh signal to refresh a next memory cell row of the DRAM at a changed refresh interval, after a refresh event is executed in response to the second refresh signal.

2. The refresh controlling method of claim 1, wherein the initial refresh interval is obtained by dividing a refresh period by a sum of a number of rows of the DRAM and a number of times a bus blank is allowed.

3. The refresh controlling method of claim 1, wherein if the bus approval signal depending on the bus blank period is consecutively applied, the second refresh signal is consecutively generated less than a predetermined number of times a bus blank is allowed.

4. The refresh controlling method of claim 1, wherein the changed refresh interval depends on the initial refresh interval, a point of time when the bus approval signal depending on the bus blank period is generated, and a number of times a bus blank is allowed.

5. A computer-readable recording medium on which a program for executing the method of claim 1 is recorded.

6. A refresh controlling apparatus, by which given a plurality of bus master devices, a DRAM with n rows of memory cells is refreshed during a predetermined refresh period, the refresh controlling apparatus comprising:

a count initialization value setting unit to set a count initialization value at an initial refresh interval or a changed refresh interval;

a bus request signal generation unit to generate a bus request signal when the count initialization value is completely counted;

a refresh signal generator to generate a refresh signal when a bus approval signal is generated by detection of a bus blank period, during which a bus request signal is not received from the bus master devices, or when a bus approval signal is generated in response to the bus request signal received from the bus request signal generation unit; and a bus blank determiner to determine whether the bus approval signal has been generated due to the bus blank period according to a logic signal received from the bus request signal generation unit, and to control the count initialization value setting unit, the bus request signal generation unit, and the refresh signal generator, upon determining that the bus approval signal has been generated due to the bus blank period.

7. The refresh controlling apparatus of claim 6, wherein the initial refresh interval is obtained by dividing a refresh period by a sum of a number of rows of the DRAM and a number of times a bus blank is allowed.

8. The refresh controlling apparatus of claim 6, wherein the bus blank determiner controls the refresh signal generator so that if the bus approval signal depending on the bus blank period is consecutively applied, the refresh signal is consecutively generated less than a predetermined number of times a bus blank is allowed.

9. The refresh controlling apparatus of claim 6, wherein the changed refresh interval depends on the initial refresh interval, a point of time when the bus approval signal depending on the bus blank period is generated, and a number of times a bus blank is allowed.

10. The refresh controlling apparatus of claim 6, wherein the count initialization value setting unit comprises:

a storage unit to store the initial refresh interval;

an adder to add the initial refresh interval received from the storage unit to a residual refresh interval under the control of the bus blank determiner to obtain a changed refresh interval; and a selector to output either the initial refresh interval or the changed refresh interval under the control of the bus blank determiner.

11. The refresh controlling apparatus of claim 10, wherein the bus request signal generation unit comprises:
- a counter to count the initial refresh interval or the changed refresh interval received from the selector and to stop counting under the control of the bus blank determiner; and
- a comparator to determine whether the counter has completed counting by the initial refresh interval or the changed refresh interval and to generate a bus request signal upon determining that the counter has completed counting by the initial refresh interval or the changed refresh interval.

12. The refresh controlling apparatus of claim 6, wherein the bus blank determiner controls the refresh signal generator so that if a bus blank is allowed K times within the initial refresh interval, first to K-th refresh signals are each generated before the initial refresh interval is completely counted, and controls the count initialization value setting unit and the bus request signal generation unit so that a (K+1)th refresh signal is generated at the changed refresh interval.

13. A controller system comprising:
- a bus mediator to mediate a right of use of a bus among a plurality of bus master devices and to automatically generate a bus approval signal during a bus blank period, during which a bus request signal is not received from the bus master devices; and
- a refresh controlling unit to refresh each of n rows of a DRAM during a predetermined refresh period at an initial refresh interval, to refresh a respective row when the bus approval signal depending on the bus blank period is generated by the bus mediator before the initial refresh interval is completely lapsed, and to refresh the next row at a changed refresh interval.

14. The controller system of claim 13, wherein the refresh controlling unit comprises:
- a count initialization value setting unit to set a count initialization value at an initial refresh interval or a changed refresh interval;
- a bus request signal generation unit to generate a bus request signal when the count initialization value is completely counted;
- a refresh signal generator to generate a refresh signal when a bus approval signal is generated by detection of a bus blank period, during which a bus request signal is not received from the bus master devices, or when a bus approval signal is generated in response to the bus request signal received from the bus request signal generation unit; and
- a bus blank determiner to determine whether the bus approval signal has been generated due to the bus blank period according to a logic signal received from the bus request signal generation unit, and to control the count initialization value setting unit, the bus request signal generation unit, and the refresh signal generator, upon determining that the bus approval signal has been generated due to the bus blank period.

15. A refresh controlling apparatus, in which given a plurality of bus master devices, a DRAM with n rows of memory cells is refreshed during a predetermined refresh period, the refresh controlling apparatus comprising:
- a first generating unit to generate a first refresh signal to refresh each of the memory cell rows of the DRAM at an initial refresh interval;
- a second generating unit to generate a second refresh signal, when a bus blank period during which a bus request signal is not received from the bus master devices, occurs before the initial refresh interval is completely lapsed, and a bus approval signal is accordingly applied; and
- a third generating unit to generate a third refresh signal to refresh a next memory cell row of the DRAM at a changed refresh interval, after a refresh event is executed in response to the second refresh signal.

16. The refresh controlling apparatus of claim 15, wherein the initial refresh interval is obtained by dividing a refresh period by a sum of a number of rows of the DRAM and a number of times a bus blank is allowed.

17. The refresh controlling apparatus of claim 15, wherein if the bus approval signal depending on the bus blank period is consecutively applied, the second refresh signal is consecutively generated less than a predetermined number of times a bus blank is allowed.

18. The refresh controlling apparatus of claim 15, wherein the changed refresh interval depends on the initial refresh interval, a point of time when the bus approval signal depending on the bus blank period is generated, and a number of times a bus blank is allowed.

19. A refresh controlling method, by which given a plurality of bus master devices, a DRAM with n rows of memory cells is refreshed during a predetermined refresh period, the refresh controlling method comprising:
- setting a count initialization value at an initial refresh interval or a changed refresh interval with a count initialization value setting unit;
- generating a bus request signal when the count initialization value is completely counted with a bus request signal generation unit;
- generating a refresh signal when a bus approval signal is generated by detection of a bus blank period, during which a bus request signal is not received from the bus master devices, or when a bus approval signal is generated in response to the bus request signal received from the bus request signal generation unit with a refresh signal generator; and
- determining whether the bus approval signal has been generated due to the bus blank period, according to a logic signal received from the bus request signal generation unit, and controlling the count initialization value setting unit, the bus request signal generation unit, and the refresh signal generator with a bus blank determiner, upon determining that the bus approval signal has been generated due to the bus blank period.

20. The refresh controlling method of claim 19, wherein the initial refresh interval is obtained by dividing a refresh period by a sum of a number of rows of the DRAM and a number of times a bus blank is allowed.

21. The refresh controlling method of claim 19, further comprising:
- controlling the refresh signal generator with the bus blank determiner so that if the bus approval signal depending on the bus blank period is consecutively applied, the refresh signal is consecutively generated less than a predetermined number of times a bus blank is allowed.

22. The refresh controlling method of claim 19, wherein the changed refresh interval depends on the initial refresh interval, a point of time when the bus approval signal depending on the bus blank period is generated, and a number of times a bus blank is allowed.

23. The refresh controlling method of claim 19, wherein the setting the count initialization value at the initial refresh interval or the changed refresh interval with the count initialization value setting unit comprises:

storing the initial refresh interval in a storage unit;

adding the initial refresh interval received from the storage unit to a residual refresh interval under the control of the bus blank determiner to obtain a changed refresh interval with an adder; and outputting either the initial refresh interval or the changed refresh interval under the control of the bus blank determiner to a selector.

24. The refresh controlling method of claim 23, wherein the generating the bus request signal when the count initialization value is completely counted with the bus request signal generation unit comprises:

counting the initial refresh interval or the changed refresh interval received from the selector and stopping the counting under the control of the bus blank determiner with a counter; and determining whether the counter has completed counting by the initial refresh interval or the changed refresh interval and generating a bus request signal with a comparator upon determining that the counter has completed counting by the initial refresh interval or the changed refresh interval.

* * * * *